(12) United States Patent
Wada

(10) Patent No.: US 6,274,919 B1
(45) Date of Patent: *Aug. 14, 2001

(54) SEMICONDUCTOR DEVICE HAVING A FIELD-SHIELD DEVICE ISOLATION STRUCTURE

(75) Inventor: Toshio Wada, Tateyama (JP)

(73) Assignee: Nippon Steel Semiconductor Corporation, Tateyama (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/115,240

(22) Filed: Jul. 14, 1998

Related U.S. Application Data

(62) Division of application No. 08/659,653, filed on Jun. 6, 1996, now Pat. No. 5,859,466.

(30) Foreign Application Priority Data

Jun. 7, 1995 (JP) .................................................. 7-140881
Aug. 24, 1995 (JP) .................................................. 7-216378

(51) Int. Cl.[7] .................................................. H01L 29/00
(52) U.S. Cl. ........................ 257/508; 257/520; 257/640
(58) Field of Search ................................ 257/499, 505, 257/501, 506, 508, 520, 524, 640, 513; 438/361, 430

(56) References Cited

U.S. PATENT DOCUMENTS

| | | |
|---|---|---|
| 4,493,740 | 1/1985 | Komeda . |
| 4,688,069 | 8/1987 | Joy et al. . |
| 4,819,052 | 4/1989 | Hutter . |
| 4,825,278 | 4/1989 | Hillenius et al. . |
| 4,924,284 | 5/1990 | Beyer et al. . |
| 4,925,805 | 5/1990 | Van Ommen et al. . |
| 4,939,567 | 7/1990 | Kenney . |
| 4,983,226 | 1/1991 | Hunter et al. . |
| 4,984,055 | * 1/1991 | Okumura et al. ........... 257/644 |
| 5,097,310 | 3/1992 | Eimuri et al. . |
| 5,241,211 | * 8/1993 | Tashiro .................. 257/506 |
| 5,248,894 | * 9/1993 | Beasom .................. 257/519 |
| 5,457,339 | * 10/1995 | Komori et al. ........... 257/510 |
| 5,859,466 | * 1/1999 | Wada ...................... 257/508 |

FOREIGN PATENT DOCUMENTS

| | | |
|---|---|---|
| 59-84435 | 5/1984 | (JP) . |
| 60-206040 | 10/1985 | (JP) . |
| 61-252645 | 11/1986 | (JP) . |

(List continued on next page.)

*Primary Examiner*—Olik Chaudhuri
*Assistant Examiner*—Hoai Pham
(74) *Attorney, Agent, or Firm*—Oblon, Spivak, McClelland, Maier & Neustadt, P.C.

(57) ABSTRACT

An LSI semiconductor device having a device isolation structure and a method of fabricating the isolation structure are presented. The device is a buried-type field-shielding device which is fabricated in non-active regions of the LSI circuit, and includes field-shield insulator film formed on the interior walls of trench cavities formed on the substrate and the field-shield electrodes buried within the trench cavity. Unlike the conventional buried-type isolation devices, the top surface of present isolation structure is level with the upper surface of the substrate. Therefore, this device structure utilizes the interior space of the substrate rather than the surface area of the substrate as in the conventional field-shield isolation structure. The isolation structure not only achieves a higher density of integration of active devices in a given space of the substrate but also simplifies the design of interconnection lines, thereby suggesting a path to production of very large integrated circuits economically in the future.

7 Claims, 11 Drawing Sheets

FOREIGN PATENT DOCUMENTS

| | | |
|---|---|---|
| 61-290753 | 12/1986 | (JP) . |
| 62-58658 | 3/1987 | (JP) . |
| 63-122145 | 5/1988 | (JP) . |
| 2-98959 | 4/1990 | (JP) . |
| 2-168666 | 6/1990 | (JP) . |
| 2-172253 | 7/1990 | (JP) . |
| 2-211651 | 8/1990 | (JP) . |
| 3-21039 | 1/1991 | (JP) . |
| 4-225260 | 8/1992 | (JP) . |
| 5-013563 | 1/1993 | (JP) . |
| 5-055361 | 3/1993 | (JP) . |
| 5-109886 | 4/1993 | (JP) . |
| 05-206260 | 8/1993 | (JP) . |
| 5-299498 | 11/1993 | (JP) . |
| 06-140500 | 5/1994 | (JP) . |
| 7-099237 | 4/1995 | (JP) . |

\* cited by examiner

SEMICONDUCTOR DEVICE HAVING A FIELD-SHIELD DEVICE ISOLATION STRUCTURE

This is a divisional of application Ser. No. 08/659,653 filed Jun. 6, 1996, now U.S. Pat. No. 5,859,466.

BACKGROUND OF THE INVENTION

1. Field of the Invention

The present invention relates in general to semiconductor devices, and relates in particular to a semiconductor device having a field-shield device isolation structure for isolation of devices in a high density MOSLSI circuit and a method of fabrication thereof.

2. Description of the Related Art

Isolation of device elements fabricated on silicon substrate has often been carried out by forming thick oxide films on selected local areas by the so-called Local Oxidation of Silicon method (shortened to LOCOS method hereinbelow). However, one of the serious barriers to achieving a higher density of integration by the LOCOS method has been a lateral growth of oxide film from the peripheries of the oxide film towards active device regions, the so-called bird's beak growth phenomenon which occurs during the thermal oxidation process. For this reason, there have been interests in other methods of isolation of active devices in large scale integration circuits, and particular interests have been focused on an isolation approach called field-shield device isolation method.

Field-shield device isolation method relates to a MOS (metal oxide semiconductor) structure for separating devices by forming a field-shield insulator film and a field-shield electrode between two active regions of a device. By fixing the field-shield electrode potential at a reference potential (e.g, GND or OV), the formation of parasitic channels on the device surface is prevented, thereby providing insulative isolation of the active regions of the devices. In the presentation below, the field-shield device isolation is referred to as FSDI.

An improved version of the FSDI structure is known in which the field-shield insulator film and the field-shield electrode are buried in a trench. By utilizing such a buried-structure configuration, it is expected that higher integration of circuits may be realized.

However, the conventional FSDI structure is still inadequate for the purposes of attaining the degree of integration densities required in modern semiconductor devices. For example, even in those devices having the buried FSDI structure intending to increase the integration density, the top portion of T-shaped cross-section field-shield electrode is exposed on the surface of the substrate such that the width of the top end of the field-shield electrode is wider than the width of the trench width. In other words, much of the valuable surface space is occupied by the non-active regions serving the purpose of device isolation. This is obviously an undesirable aspect of the conventional FSDI structure, and there has been a need to improve the structural configuration of the existing FSDI stricture to meet the increasing demand for higher integration density in modern semiconductor devices.

SUMMARY OF THE INVENTION

It is an object of the present invention to provide a semiconductor device having a field-shield structure which would enable to attain a higher degree of integration of circuits in the semiconductor device, and a method of making such a field-shield structure.

The object has been achieved in a semiconductor device means having a field-shield device isolation structure fabricated in non-active regions of the semiconductor device arranged on a semiconductor substrate, the field-shield device isolation structure comprising: a field-shield insulator film for providing inter-device electrical isolation among a plurality of devices fabricated on the semiconductor substrate; a field-shield electrode for being provided with a reference potential; wherein the field-shield insulator film is formed on interior surfaces of a trench cavity whose cavity opening faces an upper surface of the semiconductor substrate and whose depth dimension is deeper than a diffusion distance of a dopant species associated with a device of the plurality of devices, and the field-shield electrode is buried in an interior space of the trench cavity lined with the field-shield insulator film so that a top surface of the field-shield electrode is level with the upper surface of the semiconductor substrate.

According to the semiconductor device presented above, because both the field-shield insulator film and the field-shield electrode are buried within their own trenches having a depth dimension larger than those for the source and drain diffusion layers, the effective isolation distance between the diffusion layers is equal to the distance of the width and twice the depth dimensions of a trench. Therefore, compared with a conventional non-buried type device, the effective isolation dimension is increased substantially. Additionally, in the case of the present device, because the top surface of the field-shield electrode is coplanar or level with the upper surface of the substrate, the area required for the device isolation structure is only that area required for the width of the trench cavity. Therefore, compared with the conventional buried-type field-shield device isolation structures, a higher degree of integration density can be achieved in a given area of a substrate.

An aspect of the semiconductor device is that the field-shield device isolation structure comprises: a field-shield insulator film for providing inter-device electrical isolation for a plurality of devices fabricated on the semiconductor substrate; a field-shield electrode for being provided with a reference potential; wherein the field-shield insulator film is formed on interior surfaces of a trench cavity whose cavity opening faces an upper surface of the semiconductor substrate, and whose depth dimension is deeper than a diffusion distance of a dopant species associated with a device of the plurality of devices, and the field-shield electrode is buried in an interior space of the trench cavity lined with the field-shield insulator film so that a top surface of the field-shield electrode is level with the upper surface of the semi-conductor substrate and that a bottom surface of the field-shield electrode is in electrical contact with the semi-conductor substrate.

According to the aspect of the device presented above, because the bottom surface of the field-shield electrode is in electrical contact with the substrate, the overall interconnection design, including the electrode lines for applying voltages to the field-shield electrode and the substrate, can be greatly simplified. The advantage of this design approach is that, compared with the conventional buried-type isolation devices, a higher degree of integration can be achieved within a given area of a substrate.

Another aspect of the present invention relates to a method for making a semiconductor device presented above, and comprises the steps of: forming a trench cavity, which opens to an upper surface of the semiconductor substrate and has a depth dimension deeper than a diffusion distance of a dopant species associated with a device, on an upper surface of the semiconductor substrate; forming a field-shield insulator film on interior surfaces of the trench cavity; and forming a field-shield electrode by filling an interior space of the trench cavity and terminating a top surface of the field-shield electrode so as to be level with the upper surface of the semiconductor substrate.

Another approach to the method for making a semiconductor device means comprises the steps of: forming a trench cavity, which opens to an upper surface of the semiconductor substrate and has a depth dimension deeper than a diffusion distance of a dopant species associated with a device, on an upper surface of the semiconductor substrate; forming a field-shield insulator film on interior surfaces of the trench cavity; removing the field-shield insulator film only from a bottom surface of the trench cavity so as to expose an internal surface of the semiconductor substrate; fabricating a doped region, of an identical conductivity type to the given conductivity type, on the internal surface and forming a field-shield electrode by filling an interior space of the trench cavity and terminating a top surface of the field-shield electrode so as to be level with the upper surface of the semiconductor substrate.

The above methods of production of the device enables to achieve the high degree of integration density required for modern semiconductor devices. As an example, the methods involve the steps of making the field-shield electrode material to a height higher than the level of opening of the trench cavity, and later planarizing the deposit to be level with the substrate surface by such methods as chemical mechanical polishing, etch back and wet etching. The method leads to a much simpler and economical production approach to making the buried-type isolation device without the use of photolithography.

DESCRIPTION OF THE PREFERRED EMBODIMENTS

A first embodiment of the semiconductor device of the present invention will be explained with reference to drawings.

Figure 1A:
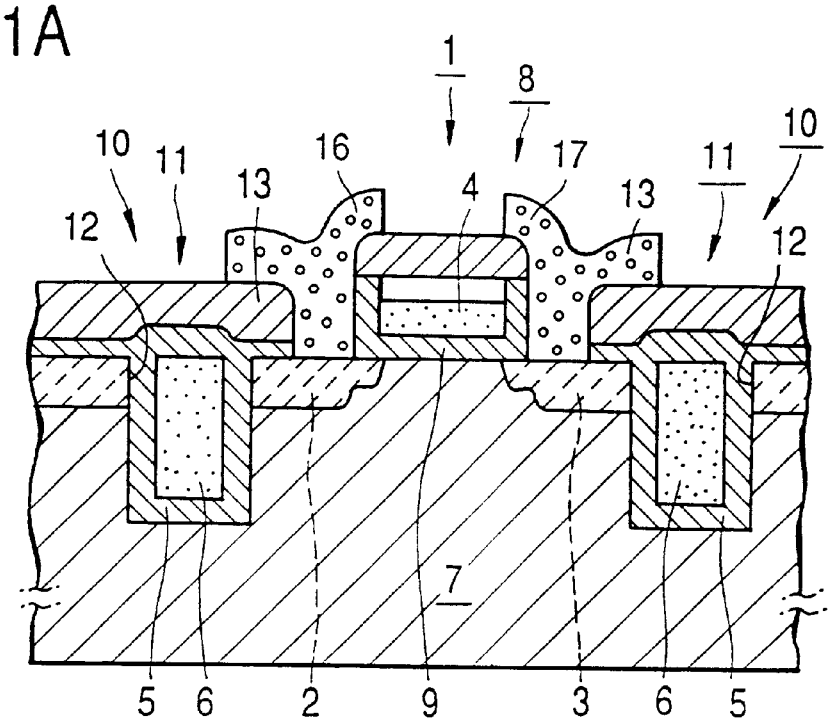
FIG. 1A is a vertical cross sectional view of a first embodiment of the semiconductor device of the present invention seen through a section A—A indicated in FIG. 1B.
Figure 1B:
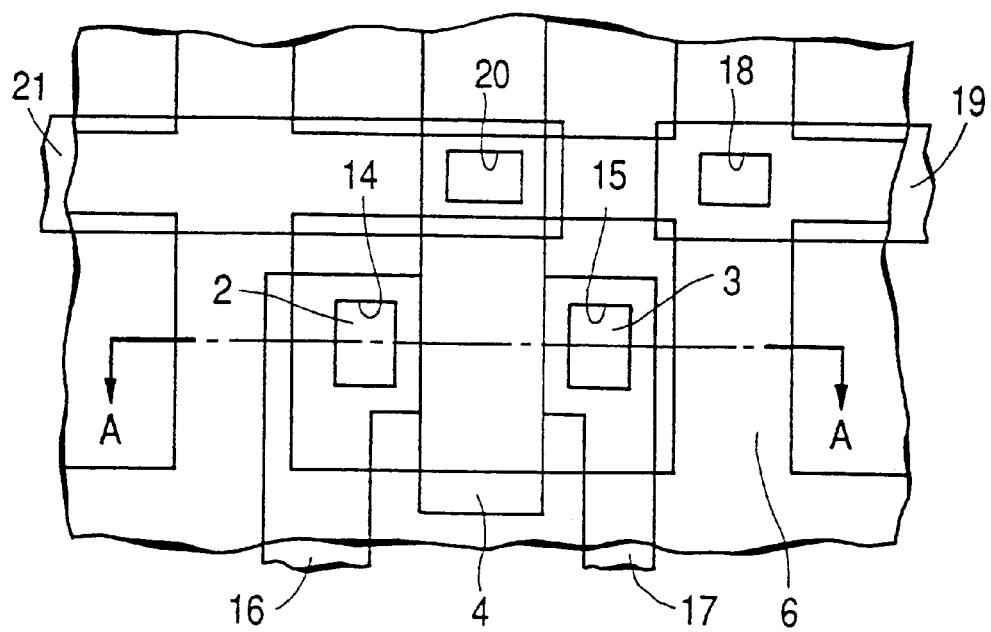
FIG. 1B is a plan view of the first embodiment of the semiconductor device of the present invention.

FIGS. 1A and 1B show a FSDI structure in a MOSLSI device comprising: an N-channel MOS transistor 1; a source diffusion layer 2; a drain diffusion layer 3; a gate-electrode 4; a field-shield insulator film 5; and a field-shield electrode 6.

As shown in FIG. 1A, the N-channel MOS transistor 1 is fabricated on an active region 8 on an upper surface of a semiconductor substrate 7. The N-channel MOS transistor 1 comprises: a gate electrode 4 formed of a polycrystalline silicon film; a gate insulator film 9 formed of a silicon dioxide (SiO2) film of 10~14 nm thickness; an N-type source diffusion layer 2; and an N-type drain diffusion layer 3 of a lightly doped drain (LDD) structure. The regions between the active regions 8 are non-active regions 10 which are utilized for fabrication of the FSDI structure 11 for isolating the neighboring MOS transistors 1.

The FSDI structure 11 consists of a field-shield insulator film 5 and a field-shield electrode 6. Within the non-active region 10, there is a trench cavity (shortened to trench hereinbelow) 12 with its opening terminating at the surface of the substrate 7, and having a cavity depth dimension larger than the depth dimensions of the source and drain diffusion layer 2 and 3. The interior surfaces of the trench 12 are provided with the field-shield insulator film 5 fabricated along its entire interior surfaces thereby burying the field-shield electrode 6 in its interior space surrounded by the field-shield insulator film 5. The top surface of the field-shield electrode is coplanar (i.e. level) with the upper surface of the substrate 7. An interlayer insulator film 13 is provided over the field-shield electrode 6.

As shown in FIGS. 1A and 1B, electrode lines 16 and 17 are provided, respectively, for the source and drain diffusion layers 2 and 3 through corresponding contact holes 14 and 15. An electrode line 19 is provided for the field-shield electrode 6 through a contact hole 18, and a gate line 21 for the gate electrode 4 through a contact hole 20.

In the following, a method of fabricating the MOSLSI device of the configuration described above will be explained with reference to the steps illustrated in FIGS. 2A~2G.

Figure 2A:
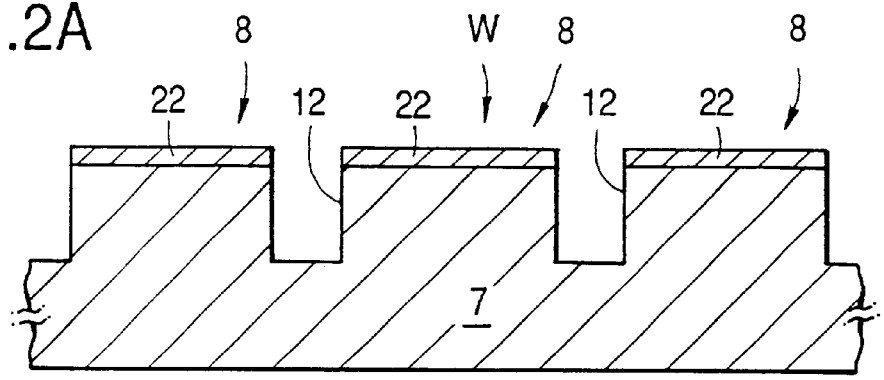
FIGS. 2A~2G are schematic illustrations to show the successive steps for making the semiconductor device of the first embodiment.

First, as shown in FIG. 2A, the cavities for the trenches 12 are fabricated on the upper surface of a wafer W (includes a substrate 7 of a P-type monocrystalline silicon having a specific resistance 3~4 ohm·cm) by process of etching through an etching mask of a SiO$_2$ film 22, for protecting those active regions 8 for fabricating the N-channel MOS transistor but exposing those regions for forming the trenches 12. The process of forming the trenches 12 used in this embodiment is a dry etching process using gaseous chlorine to make a cavity measuring 0.5~1.5 μm in depth and 0.2~0.5 μm in width.

Figure 2B:
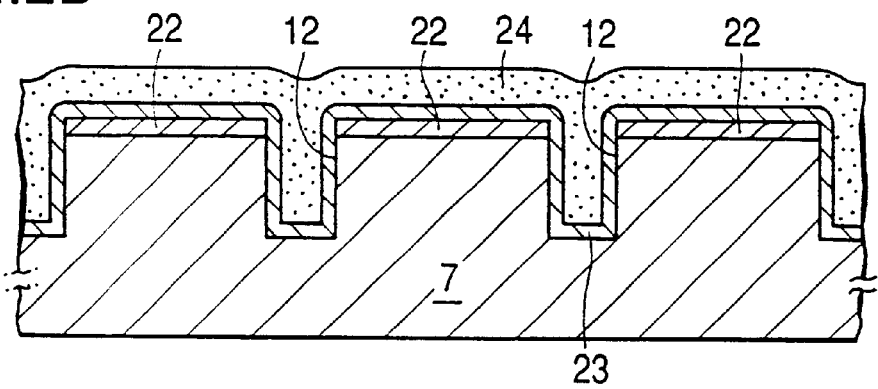

Next, as shown in FIG. 2B, a SiO$_2$ insulator film 23 having a 10~80 nm thickness is fabricated on the surface of the wafer W by means of a thermal oxidation process or a vapor deposition process. This step is followed by another vapor deposition process to form a polycrystalline silicon deposit 24 of 100~500 nm thickness on the entire surface of the wafer W. The polycrystalline silicon deposit 24 fills the entire cavity space of the trenches 12, and is made electrically conductive by doping with an impurity such as phosphorus to be incorporated therein by doping during either the deposition process or by diffusion process subsequent to the deposition process.

Figure 2C:
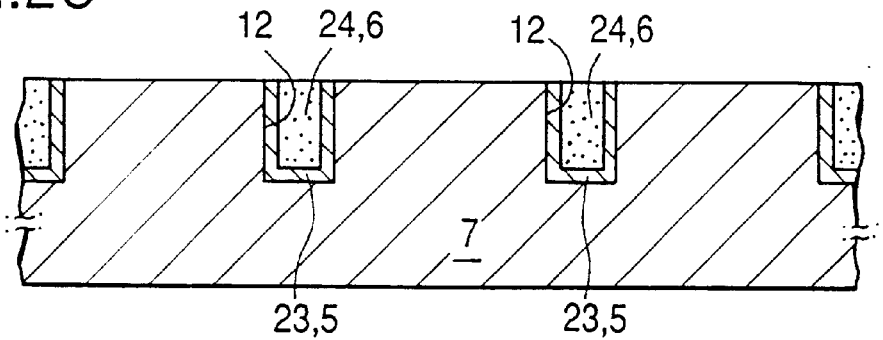

Next, as shown in FIG. 2C, chemical mechanical polishing (shortened to CMP hereinbelow) is carried out on the entire surface of the wafer W until the surface of the substrate 7 becomes exposed, by removing the polycrystalline silicon deposit 24 deposited on the upper surface of the substrate 7. This step produces a such configuration shown in FIG. 2C that the polycrystalline silicon deposit 24 is present (buried) only within the interior boundaries of the trenches 12. CMP performs planarization by a combined action of chemical and mechanical polishing using chemicals such as alkaline solution together with polishing particles. Simultaneously with or subsequent to the CMP step, the SiO2 films 22, 23 which have been protecting the surface of the substrate 7 to this stage are also removed. The SiO2 film 23 thus left within the trench 12 constitutes the field-shield insulator film 5 and the polycrystalline silicon deposit 24 buried in the interior of the field-shield insulator film 5 constitutes the field-shield electrode 6.

Figure 2D:
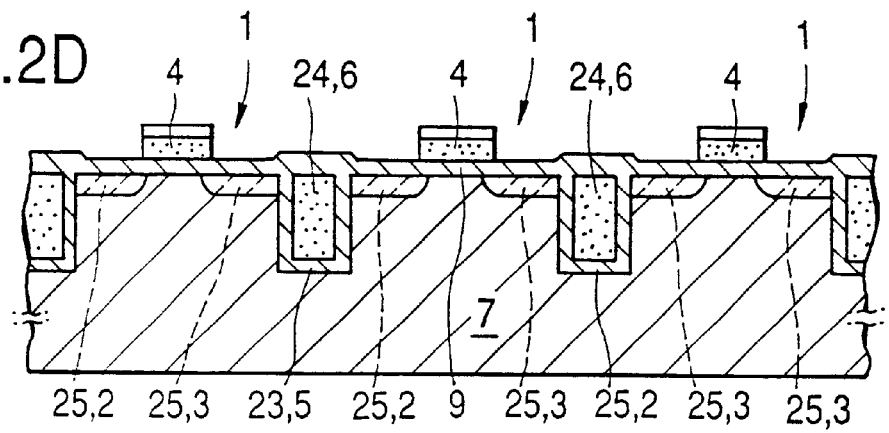

Next, as shown in FIG. 2D, the active regions 8 are subjected to the conventional fabrication steps for making MOS transistors. That is, the regions to correspond with the active regions 8 of the substrate 7 are provided with the gate insulator film 9 of SiO2 of 10~14 nm thickness made by a process of thermal oxidation. Using the polycrystalline silicon gate electrode 4 having a gate cap insulator thereon, fabricated on top of the gate insulator film 9 by a conventional photolithographical method, as the implantation mask for arsenic (As) ion implantation, a shallow N-type diffusion layer 25 having a low-carrier concentration of $10^{17}$ ions/cm$^3$ and a diffusion depth of about 0.1 μm. These regions constitute respectively, the source and drain diffusion layers 2 and 3 of the N-channel MOS transistor 1.

Figure 2E:
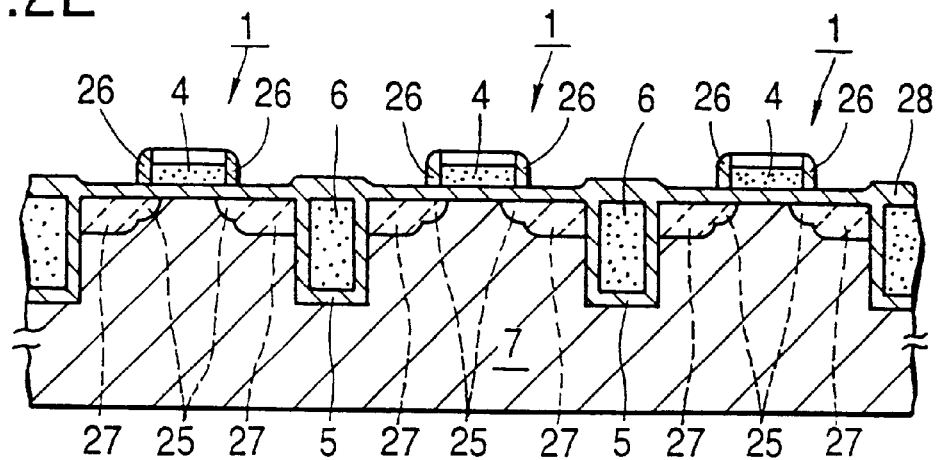

Next, as shown in FIG. 2E, device fabrication is continued to produce these transistors having an LDD structure. An insulator film is deposited on the entire surface, etched back by a conventional anisotropic etching method and formed into the insulator film 26 as a sidewall spacer, using both the insulator films 26 fabricated on both interior side-surfaces of the gate electrode 4 of the transistor 1 and the gate electrode 4 as the implantation mask, Arsenic(As) ion implantation (N-type dopant) process is carried out to produce a deep, N-type high carrier diffusion region 27 having a relatively high depth dimension of about 0.3 μm and a carrier concentration of $10^{18}$~$10^{21}$ ions/cm$^3$. By disposing the high carrier N-type diffusion region 27 deeper into the substrate 7 (away from the gate electrode 4) than the low carrier N-type diffusion region 25, the short channel effect is prevented, and produces an effect of lowering the electrical resistance of the source and drain diffusion layers 2 and 3. At this time, a SiO$_2$ film 28 is fabricated on the upper surfaces of the field-shield electrodes 6 and those of each of the source and drain diffusion layers 2 and 3 by thermal oxidation.

Figure 2F:
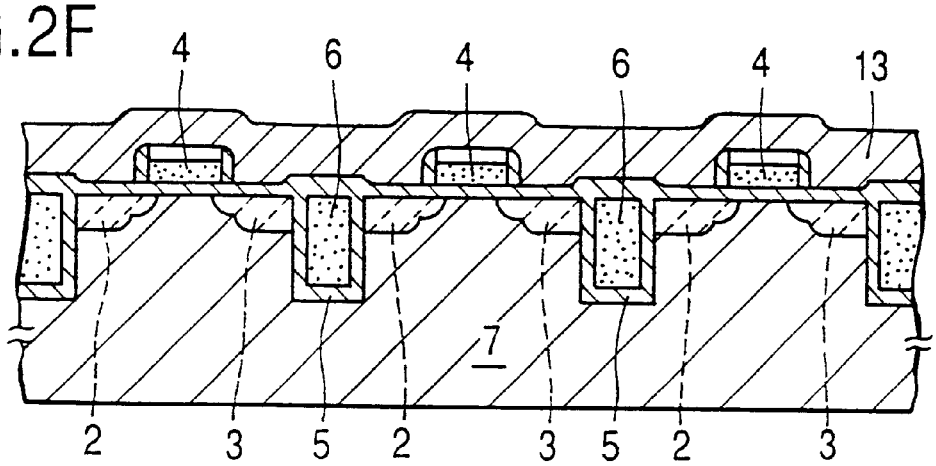

Next, as shown in FIG. 2F, the same fabrication steps as in the conventional MOS device making are taken to produce an insulator film 13 made of a silicate glass containing boron and phosphorous (BPSG) on the surface of the wafer W.

Figure 2G:
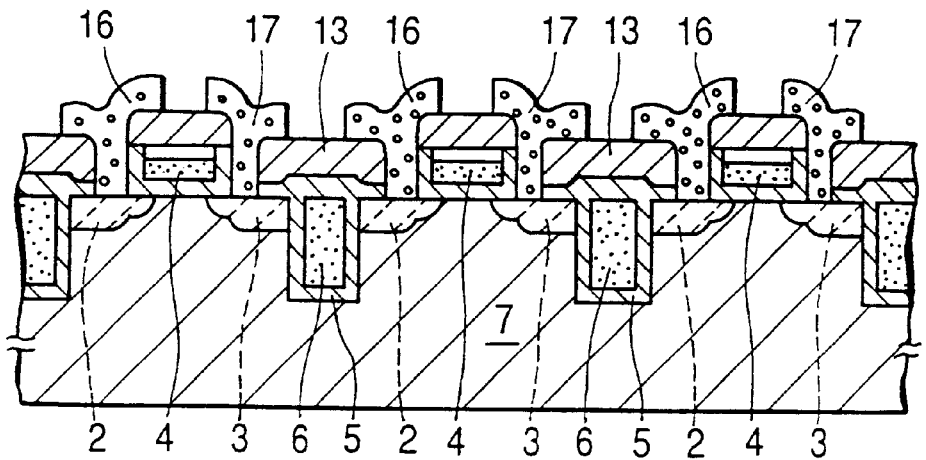

Finally, as shown in FIG. 2G, after fabricating contact holes, electrode lines 16, 17 are fabricated using such materials as conductive polycrystalline silicon, titanium-tungsten and aluminum in single layer or multiple layers, thus completing the fabrication steps for the MOSLSI device of the first embodiment.

In the MOSLSI device of the first embodiment, because both the field-shield insulator film 5 and the field-shield electrode 6 are buried within their own trenches 12 having a depth dimension larger than those for the source and drain diffusion layers 2 and 3, the effective isolation distance between the diffusion layers 2 and 3 is equal to the distance of the width and twice the depth dimensions of a trench 12. Therefore, compared with a conventional non-buried type device, the effective isolation dimension is increased substantially. In this case, the deeper the dimension of the trench 12 than that of the source and drain diffusion layers 2 and 3, the higher would be the insulative isolation capability of the FSDI structure 11.

Additionally, especially in the first embodiment device, the field-shield electrodes do not protrude out on the upper surface of the substrate 7 as in the T-shaped electrode in the conventional devices, and the top surface of the field-shield electrode 6 is level with the surface of the substrate 7. It follows that the surface area required for the isolation structure 11 needs to be only as large as the width dimension of the trench 12, thereby significantly reducing the area for the non-active region 10 compared with that required in the conventional devices. Therefore, it is obvious that the configuration of the FSDI structure 11 will result in achieving a higher device integration in a given space of a wafer, thus enabling to provide further densification of the highly integrated MOSLSI devices.

Furthermore, according to the method for making MOSLSI device presented above, the planarization by CMP for the wafer W is carried out after depositing the polycrystalline silicon deposit 24 on the field-shield insulator film 5 by vapor deposition process, there is no need to use any photolithographic processes for fabricating the field-shield electrode 6. This is a notable simplification in the processing routine compared with the conventional process routines requiring photomasking. This means a considerable lowering in the cost of manufacturing the device having the FSDI structure of the present invention.

Figure 3:
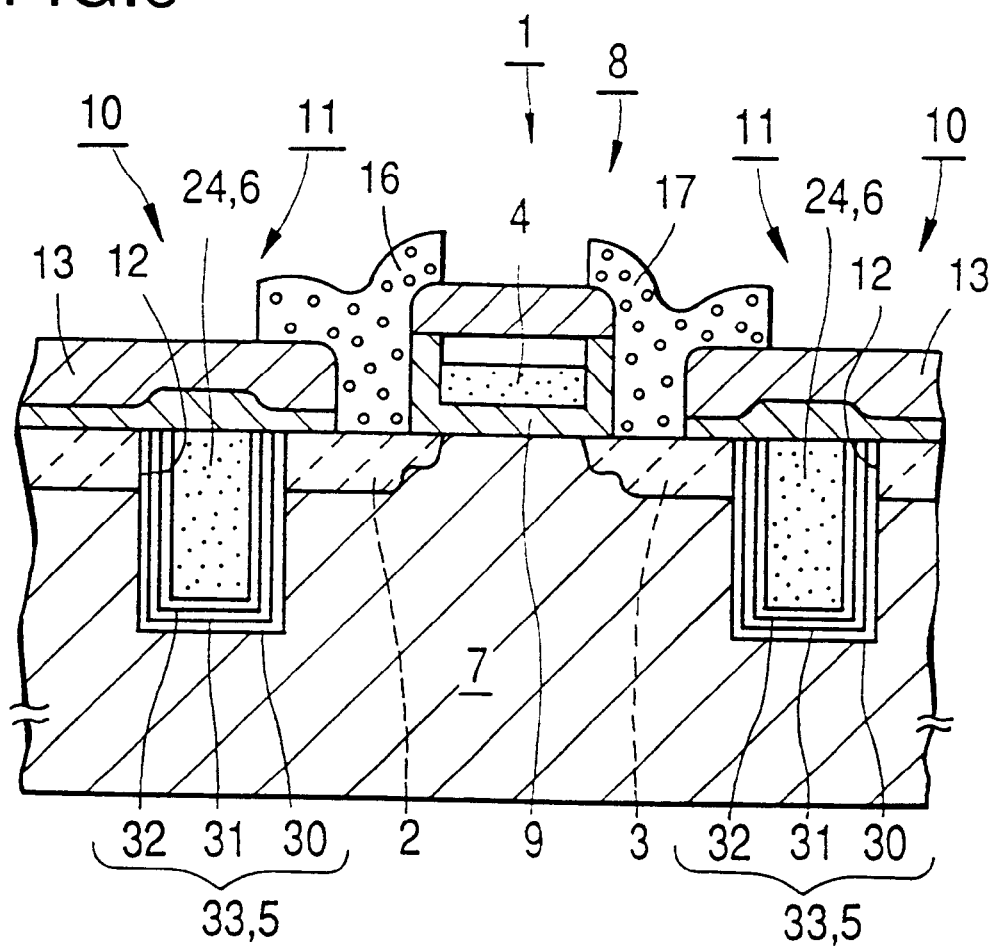
FIG. 3 is a vertical cross sectional view of a second embodiment of the semiconductor device of the present invention.

A second embodiment of the FSDI structure will be presented with reference to FIG. 3.

The only difference in the isolation structure between the second embodiment and the first embodiment is that the device isolation is achieved in a multi-layer structure in the second embodiment compared with the single layer structure presented in the first embodiment. Therefore, those device structures for performing the same functions are designated by the same reference numerals, and their explanations are omitted.

As shown in FIG. 3, the second embodiment device is produced by: forming the trenches 12 on the surface of a monocrystalline silicon substrate 7; followed by fabricating a triple-layer isolation film (i.e., field-shield isolator film 5) 33 comprising a first layer of SiO$_2$ film 30, a second layer of silicon nitride (SiN) film 31, and a SiO$_2$ film 32, on the interior surface of the trench 12. The device making process is continued, by growing a layer of polycrystalline silicon deposit 24 on the overall top surface by vapor deposition process, after which the surface of the wafer W is planarized by CMP method as in the first embodiment to complete the formation of the field-shield electrode 6 terminating on the common plane with the upper surface of the substrate 7.

The three-layer insulator film 33 is made by thermal oxidation of the surface of the substrate 7 including the interior surface of the trench 12 first, to produce a SiO$_2$ film 30 of 2~4 nm thickness, followed by forming a SiN film 31 of 4~12 nm thickness by vapor deposition process, followed by thermal oxidation of SiN layer 31 to produce a SiO$_2$ film 32 of 1~4 nm thickness.

The subsequent processing steps are identical to those in the first embodiment, i.e., gate-insulator film forming step; gate electrode forming step; source and drain diffusion layer forming step; interlayer insulation forming step; contact hole fabrication step; line fabrication step are needed to complete the fabrication of MOSLSI device as shown in FIG. 3. In this embodiment, electrode lines 16, 17 are made by filling the hole sections with successive depositions of titanium nitride and tungsten films to extend to the upper surface of the interlayer insulator film at the hole sections to make electrical contact with the electrodes of other devices by means of aluminum lines.

As in the first embodiment device, the second embodiment device has no portion of the FSDI structure 11 extending on the surface of the substrate 7, thus allowing a high density integration of active circuits, and in addition, the simple method of CMP planarization of the field-shield electrode 6 with the surface of the substrate 7 enables to manufacture highly integrated MOSLSI devices economically.

Further in this embodiment, because the field-shield insulator film 5 (as manifested by a multi-layer insulator film 33) is made up of SiO2 films 30, 32 and a SiN film 31, the field-shield isolation effect can be achieved by utilizing thin film components to further enhance the performance. The multi-layer insulator film 33 provides a highly effective insulator film exhibiting excellent shielding properties even when the polycrystalline silicon deposit 24, constituting the field-shield electrode 6, contains phosphorus or boron. In other words, according to this embodiment, by constructing the field-shield insulator film 5 to be a multi-layered composite film, it becomes possible to provide a low-defect insulator film of a substantially thinner dimension compared with a single layered isolation film, thereby improving the yield of the device as well as the shielding performance.

In the first and second embodiments, after forming the polycrystalline silicon deposit 24, the planarization step of the wafer W was carried out by using the CMP method. However, it is also permissible to utilize dry etching involving a thick coating of a photoresist material on the surface of the wafer W to etch back the entire surface of the wafer W, or to utilize wet etching involving an etching solution mixture containing primarily hydrofluoric acid and nitric acid to etch back the coating to produce a planar surface. Even though different planarization approaches may be adopted, it is still possible to simplify manufacturing processes and achieve low cost production.

Also, it is not necessary that the entire interior space of the trench be filled to construct the field-shield electrode. It is permissible to have a hollow interior structure or a cored-interior having an insulator film made by vapor depositing polycrystalline silicon followed by another vapor growth of SiO$_2$. The top surfaces of the electrode and the upper surface of the substrate may be made planar using the usual CMP method.

The dimensions quoted in the embodiments are meant to be examples, and they are not limited to the exact dimensions quoted. For example, it is permissible to have a range of dimensions such as: the trench widths may range from 80 nm~several mm; the depth of the trench may be made deeper by up to 10 $\mu$m than the depth of the diffusion layers for source and drain; the film thickness of the field-shield insulator film may range 5~200 nm; and the film thickness of the polycrystalline silicon film may range 40~800 nm.

In the second embodiment, the triple-layer structure of the insulator film (SiO$_2$—SiN—SiO$_2$) may be replaced with a double-layer structure by omitting one of the SiO$_2$ films without affecting the shielding performance of the device of the present invention.

Figure 4:
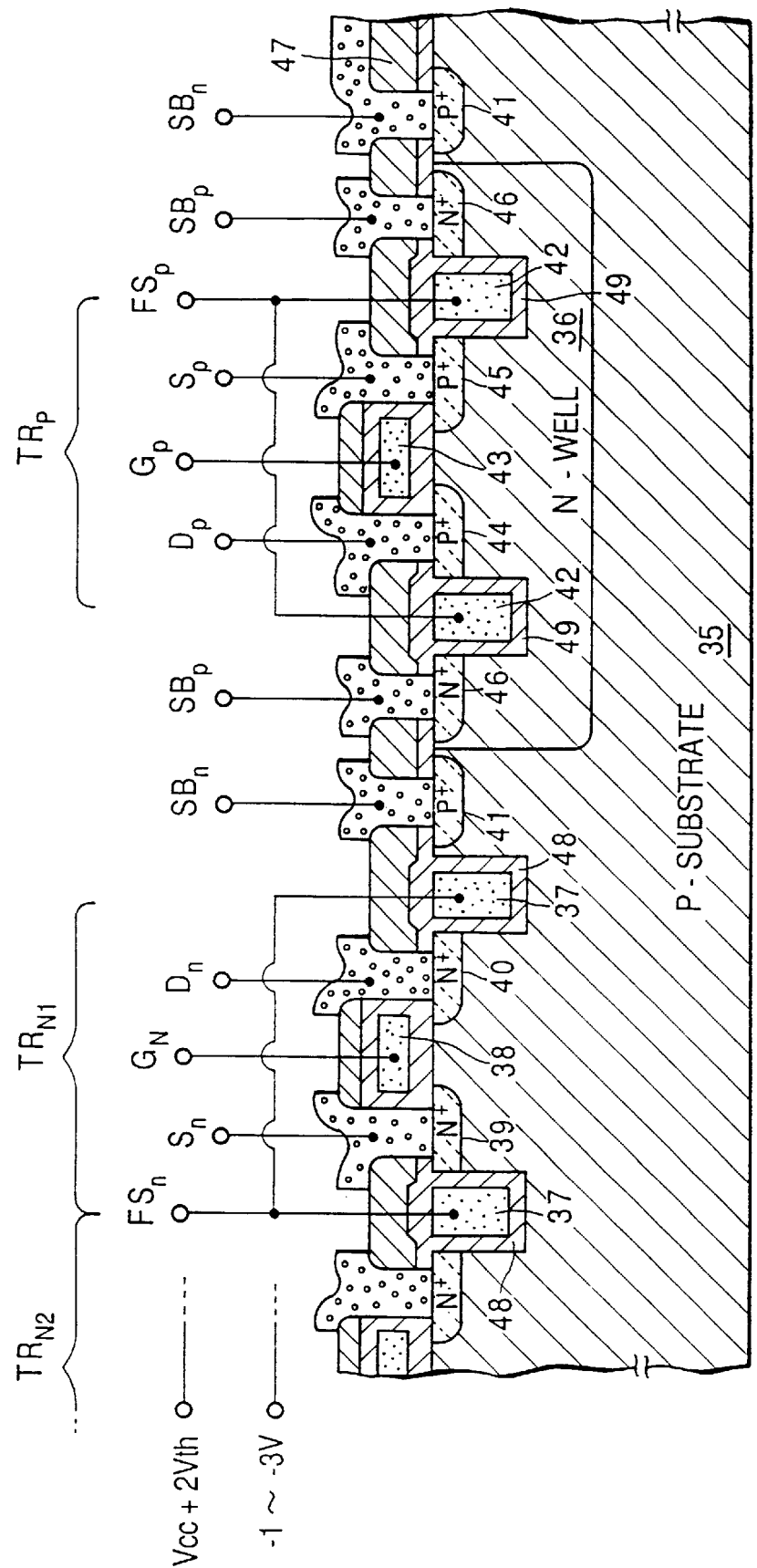
FIG. 4 is a vertical cross sectional view of a third embodiment of the semiconductor device of the present invention to particularly show the arrangement of applying voltages.

A third embodiment will be presented with reference to FIG. 4.

In this embodiment, the arrangement of voltage application to the field-shield electrode will be explained with reference to the cross sectional view of the MOSLSI device of this embodiment and the device connection lines shown in FIG. 4.

FIG. 4 shows a P-type monocrystalline silicon substrate 35 having an N-type region 36, the so-called "N-Well" region, fabricated on its surface. The region 36 comprises P-channel MOS transistors TRp. Adjacent to the N-well region 36, there are N-channel transistors TRN1, TRN2, thereby providing an LSI device based on a CMOS (complementary metal oxide semiconductor) structure on the surface of the substrate W.

The isolation for the N-channel MOS transistors TRN1, TRN2 is provided by the FSDI structures fabricated in the trenches formed between the transistors. As shown in FIG. 4, each of the field-shield electrodes 37 has an electrode line FSn, and the N-channel MOS transistor TRN1 has a gate line Gn from the gate electrode 38, a source line Sn from the N-type source diffusion layer 39, a drain line Dn from the N-type drain diffusion layer 40, and electrode lines SBn from the P-type substrate 35 through the P-type diffusion layer 41.

In the meanwhile, the isolation for the P-channel MOS transistor fabricated within the N-well 36 is provided by a FSDI structures similar to the case of the N-channel MOS transistors TRN1, TRN2. As shown in FIG. 4, each of the field-shield electrodes 42 has an electrode line FSp, and the P-channel MOS transistor TRp has a gate line Gp from the gate electrodes 43, a source line Sp from the P-type source diffusion layer 45, a drain line Dp from the P-type drain diffusion layer 44, and electrode lines SBp from the N-well region 36 through the N-type diffusion layers 46. These device lines extend parallel to the surface of the substrate 35 on the upper surface of the interlayer insulator film 47.

For any of the FSDI structures (separating the N-channel MOS transistors TP1, TRN2 and P-channel MOS transistor TRp) presented in this embodiment, the field-shield insulation films 48, 49 may be a single layer structure presented in the first embodiment or a multi-layer structure presented in the second embodiment can be utilized.

The device in this embodiment is constructed so as to supply a negative voltage of −1~−3 volts to the P-type substrate 35 from a substrate voltage generation circuit (not shown) connected to the electrode line SBn, as well as to the electrode lines FSn for the field-shield electrodes 37 disposed on the N-channel MOS transistors TRN1, TRN2, thereby supplying the same negative voltage to the field-shield electrodes 37.

In the meanwhile, the electrode line FSp for the field-shield electrode 42 in the P-channel MOS transistor TRp circuit is normally connected to a step-up voltage generation circuit (not shown) provided for the purpose of supplying word line driving potential or output buffer driving potential. In the device of this embodiment, a step-up voltage Vcc+ 2Vtn is supplied to the field-shield electrode 42, where Vtn is the threshold voltage of the N-channel MOS transistor.

It can be seen that the CMOS structure of the third embodiment device is also highly suitable for isolation of active regions of transistor devices and diffusions layers. The FSDI structures fabricated within the respective trenches belonging to each of N-channel MOS transistors and P-channel MOS transistors are therefore applicable to higher integration of MOSLSI devices.

Further, in the third embodiment device, the circuit is arranged in such a way that a negative potential is applied to the field-shield electrodes 37 for N-channel MOS transistors TRN1, TRN2, and a step-up voltage from the supply voltage is applied to the field-shield electrode 42 for the P-channel MOS transistor TRp, in contrast to the conventional field-shield devices, in which a GND potential is applied to the N-devices and the supply voltage to the P-device, and therefore, the tolerance capacity for overshooting/undershooting in the diffusion layer potential has been made comparatively larger, thereby providing a more stable isolation performance.

In other words, the third embodiment demonstrated the adaptation of the trench-type FSDI structure to a CMOSLSI device to provide effective inter-transistor isolation or inter-diffusion region isolation, thereby showing a path to realization of future ultra-high density LSI architectures.

A fourth embodiment will be explained in the following with reference to FIG. 5.

Figure 5:
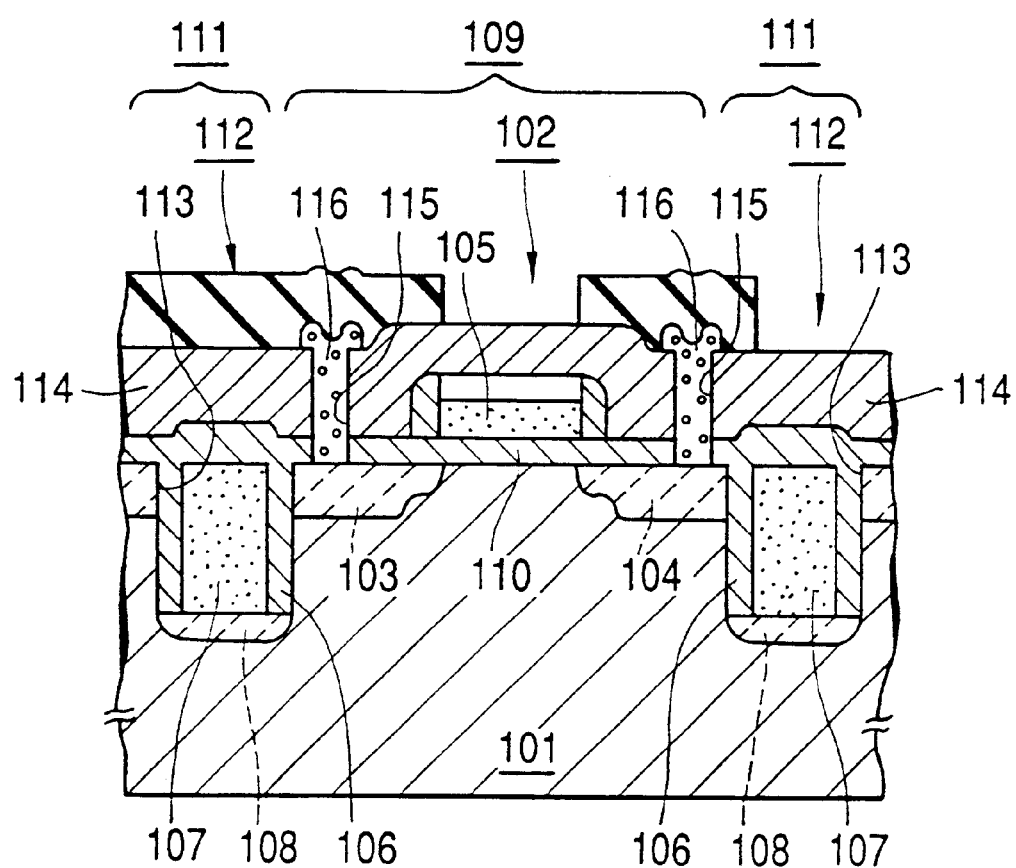
FIG. 5 is a vertical cross sectional view of a fourth embodiment of the semiconductor device of the present invention.

FIG. 5 is a FSDI structure in a MOSLSI comprising: a P-type semiconductor substrate 101; an N-channel MOS transistor 102; a source diffusion layer 103; a drain diffusion layer 104; a gate electrode 105; field-shield isolator film 106; field-shield electrodes 107; and high carrier P-type regions 108.

As shown in FIG. 5, an N-channel MOS transistor 102 is fabricated in active regions 109 on an upper surface of the P-type semiconductor substrate 101. The N-channel MOS transistor 102 comprises: a gate electrode 105 of a polycrystalline silicon film; and a gate insulator film 110 of SiO2; N-type source and drain diffusion layers 103, 104 having a lightly doped drain structure (LDD-structure). Between the active regions 109 are non-active regions 111 in which the FSDI structure 112 is fabricated to isolate the N-channel MOS transistor 102.

The FSDI structure 112 comprises a field-shield insulator film 106, a field-shield electrode 107 and a high carrier P-type region 108. Inside the non-active region 111, there are trenches 113 which open to the upper surface of the P-type substrate 101 and having a depth dimension larger than the source and drain diffusion layers 103, 104. The field-shield isolator film 106 is formed on the side walls of the trench 113. A field-shield electrode 107 is buried in the interior of the trench 113 surrounded by the field-shield isolator film 106, and the top surface of the field-shield electrode 107 is level with the upper surface of the P-type substrate 101. An interlayer insulator film 114 is fabricated above the field-shield electrode 107, and a high carrier P-type region 108 (having a higher concentration of B than that in the P-type substrate 101) is fabricated at the bottom surface of the trench 113.

Additionally, electrode lines 116 are provided from the source and drain diffusion layers 103 and 104, respectively, through the contact holes 115.

A method of fabricating the above MOSLSI structure will be presented with reference to the processing steps illustrated in FIGS. 6A to 6I.

Figure 6A:
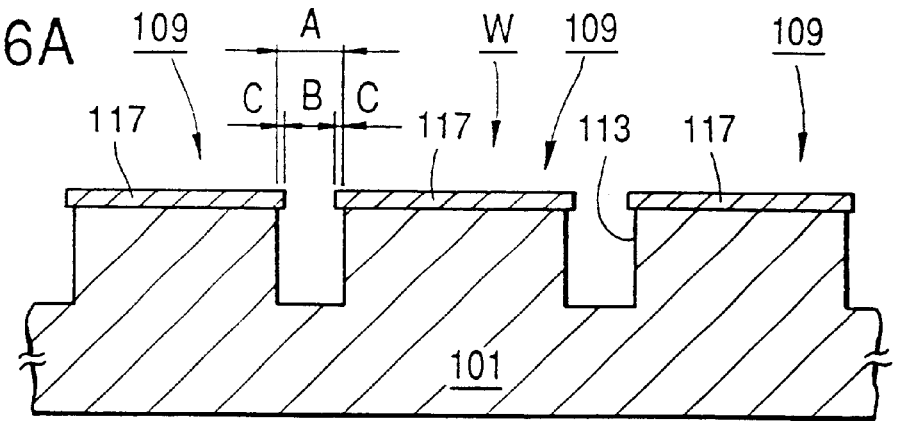
FIGS. 6A~6I are schematic illustrations to show the successive steps for making the semiconductor device of the fourth embodiment.

First, as shown in FIG. 6A, the trenches 113 are fabricated on the upper surface of a wafer W (including a substrate 101 of a P-type single crystal silicon having a specific resistance 3~4 ohm·cm) by process of etching through an etching mask of a SiO$_2$ film 117 which protects those active regions 109 for making the N-channel MOS transistor but exposes those regions for making the trenches 113.

The process of forming the trenches 113 is a dry etching process using gaseous chlorine to make cavities measuring 0.5~1.5 $\mu$m in depth and 0.2~0.5 $\mu$m in width. As illustrated in FIG. 6A, the etching process is carried out under conditions to favor etching on the side-wall surface of the cavities so that the width A of the trench 113 can be made to include an undercutting dimension C of about 0.02~0.2 $\mu$m more than the opening dimension B on the SiO$_2$ film 117. This undercut structure facilitates making of the subsequent fabrication of insulative isolation with trenches 113 to surround the active regions 109.

Figure 6B:
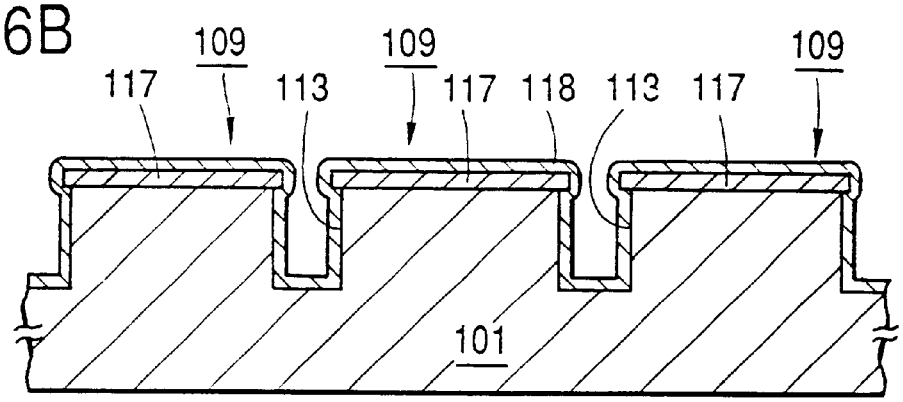

Next, as shown in FIG. 6B, a SiO$_2$ insulator film 118 having a 10~80 nm thickness is fabricated on the surface of the wafer W by means of a thermal oxidation process or a vapor deposition process, thereby encasing the SiO$_2$ film 117 deposited on the active regions 109 as well as the interior surfaces of the trenches 113 with the insulator film 118.

Figure 6C:
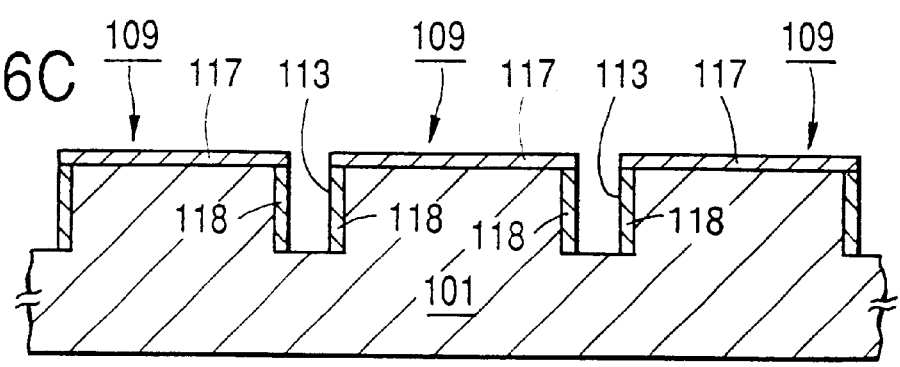

Next, as shown in FIG. 6C, the entire surface of the wafer W is dry etched so as to remove the insulator film 118 from the bottom surface of the trenches 113, thereby exposing the internal surface of the substrate 101 at the bottom of the trenches 113. This dry etching step is carried out under an anisotropic etching condition so as to remove the insulator film 118 from the upper surface of the active regions 109 and from the bottom surface of the trenches 113, but to leave the insulator film 118 on the side-wall surfaces of the trenches 113 untouched.

Figure 6D:
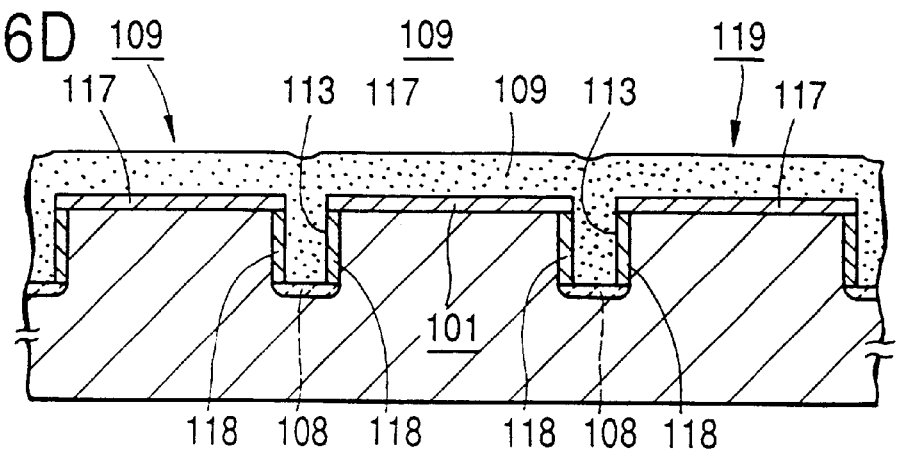

Next, as shown in FIG. 6D, boron (B) is introduced into the bottom surface of the trenches 113, which corresponds to the substrate 101, by ion-implantation to produce a P-type region 108 of a high carrier concentration of $10^{18}$~$10^{20}$ ions/cm$^3$.

This step is followed by vapor deposition step of depositing a polycrystalline silicon deposit 119 of 100~500 nm thickness to act as the field-shield electrode. The polycrystalline silicon deposit 119 is deposited so as to fill the entire interior space of the trenches 113 as well as to cover the entire surface of the wafer W. The polycrystalline silicon deposit 119 is made conductive by doping phosphorous or boron either during the vapor deposition step or after the vapor deposition step.

Incidentally, in this embodiment, ion-implantation is used to produce the P-type high carrier region 108 followed by a vapor deposition step to form the polycrystalline silicon deposit 119. It is also permissible to first carry out forming of the field-shield electrode by filling the trenches with polycrystalline silicon film containing B (the identical doping type as the substrate) prior to fabricating the P-type regions. The next step is to thermally diffuse B from the polycrystalline silicon film to form the high carrier P-type region. The advantage is that the ion-implantation step can be eliminated.

Figure 6E:
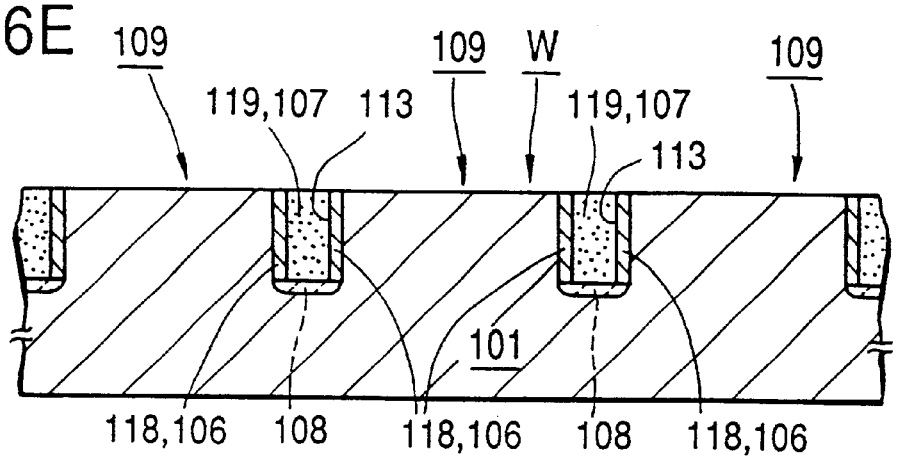

Next, as shown in FIG. 6E, the surface of the wafer W is subjected to CMP polishing step to remove the polycrystalline silicon deposit 119 until the surface of the substrate 101 becomes exposed so that the polycrystalline silicon fills only the trenches 113. Simultaneously with or subsequent to the polishing step, the surface SiO$_2$ film 117 which has protected the active regions 109 on the substrate 101 to this stage is also removed. This configuration provides the field-shield insulator film 106 constituted by the SiO$_2$ insulator film 118 remaining on the side-wall surfaces of the trenches 113, and the field-shield electrode 107 constituted by the polycrystalline silicon filling the interior spaces of the trenches 113.

Figure 6F:
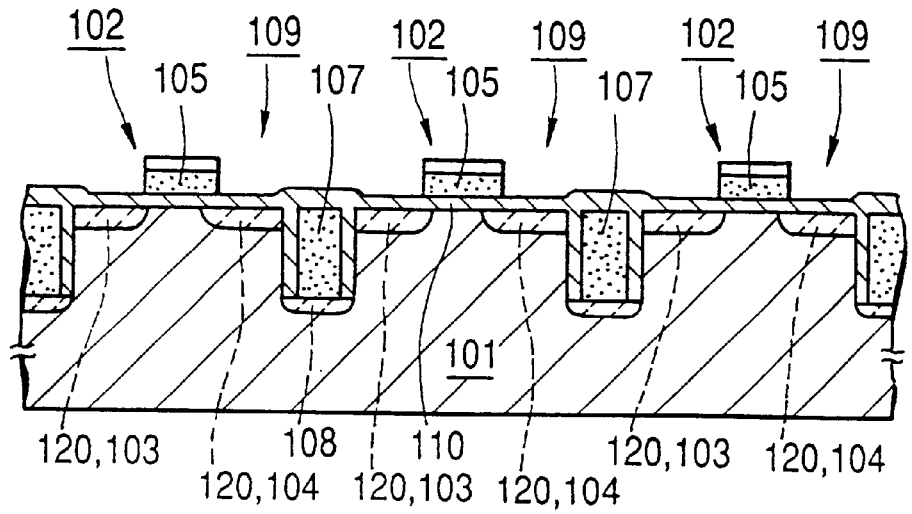

Next, as shown in FIG. 6F, the active regions 109 are subjected to the conventional fabrication steps for making MOS transistors. That is, on the regions to correspond with the active regions 109 of the substrate 101 are provided with the gate insulator film 110 of $SiO_2$ having a thickness of 10~14 nm by a process of thermal oxidation. Using the polycrystalline silicon gate electrode 105, fabricated on top of the gate insulator film 110, as the implantation mask for arsenic (As) ion implantation, a shallow N-type diffusion layer 120 having a low-carrier concentration of $10^{17}$~$10^{18}$ ions/cm$^3$ is fabricated so as to provide a diffusion depth of about 0.1 μm. These regions constitute, respectively, the source and drain diffusion layers 103 and 104 of the N-channel MOS transistor 102.

Figure 6G:
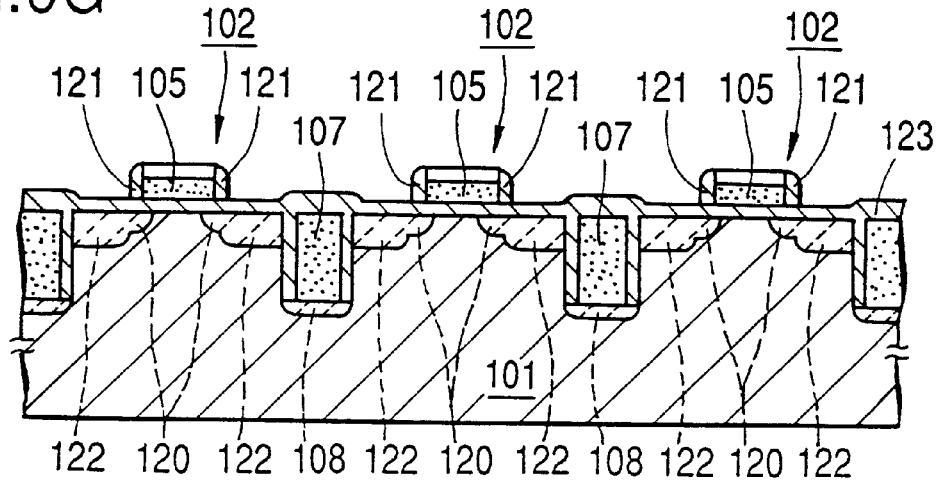

Next, as shown in FIG. 6G, processing steps are carried out to make these transistors to have an LDD structure. That is, using the insulator films 121 fabricated on both side-wall surfaces of the gate electrode 105 of the transistor 102 together with the gate electrode 105 as the implantation mask, As-ion (N-type dopant) implantation step is carried out to produce a deep N-type, high carrier diffusion layer region 122 having a carrier concentration of $10^{18}$~$10^{21}$ ions/cm$^3$ and a diffusion depth dimension of about 0.3 μm. This high carrier N-type diffusion layer region 122 extends further deeper into the substrate away from the gate electrode 105 than the region of the N-type low carrier diffusion layer 120, thereby preventing short channel effect, and produces an effect of lowering the resistance value of the source and drain diffusion layers 102 and 103. Also, $SiO_2$ film 123 is fabricated on the upper surfaces of the field-shield electrodes 107 and each of the source and drain diffusion layers 103 and 104 by thermal oxidation.

Figure 6H:
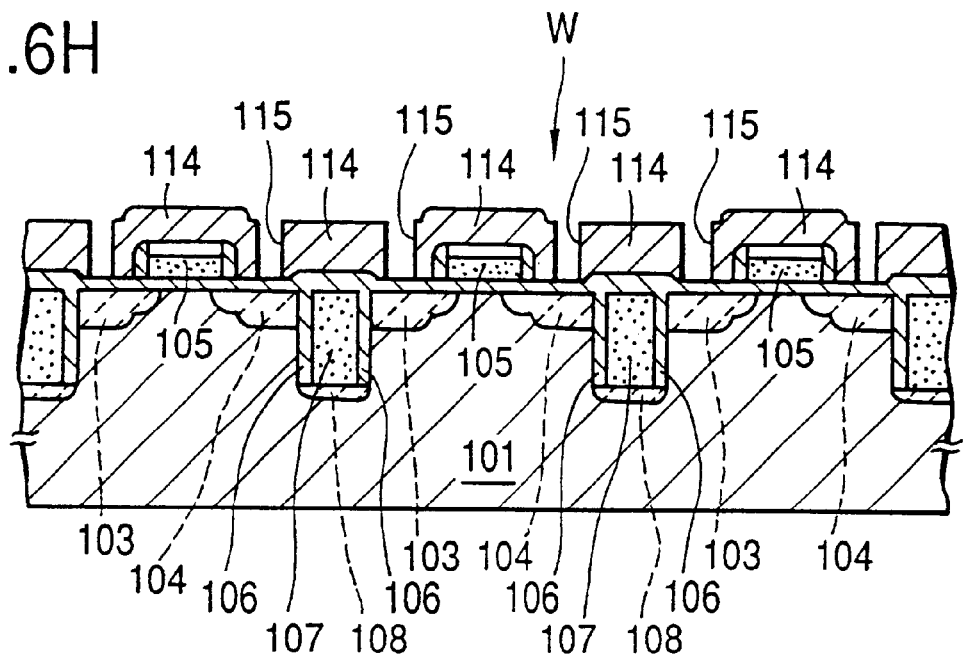

Next, as shown in FIG. 6H, the same fabrication steps as in the conventional MOS device making are taken to produce an insulator film 114 made of a silicate glass containing boron and phosphorous (BPSG) on the surface of the wafer W, after which contact holes 115 are fabricated on the upper surface of the source and drain diffusion layers 103 and 104 using photolithography.

Figure 6I:
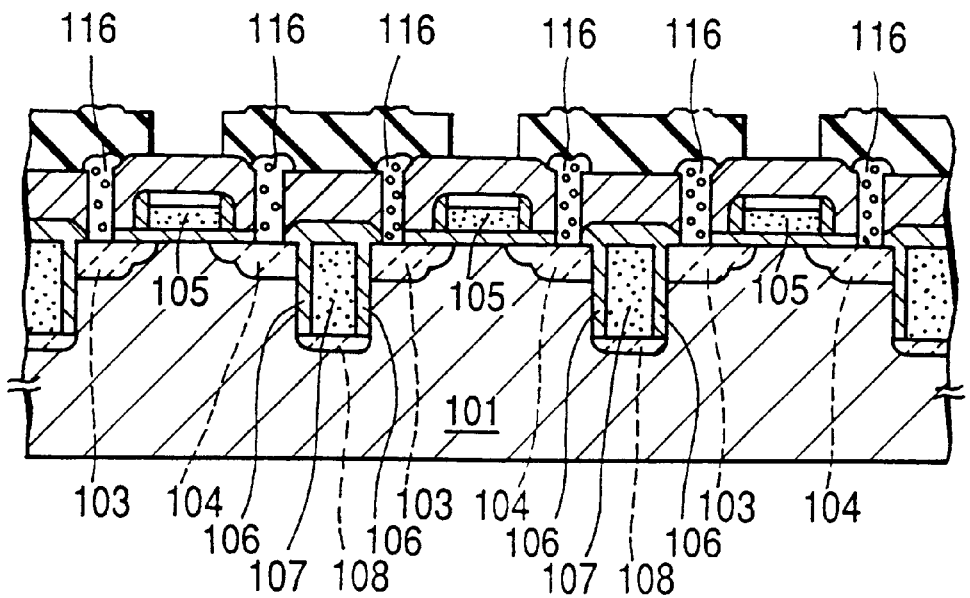

Finally, as shown in FIG. 6I, using such materials as conductive polycrystalline silicon, titanium-nitride, titanium-tungsten as a barrier material, electrode line 116 is fabricated using aluminum or tungsten in single layer or multiple layers, thus completing the fabrication steps for the MOSLSI device of the this embodiment.

In the MOSLSI device of the fourth embodiment, because both the field-shield insulator film 106 and the field-shield electrode 107 are buried within their own trenches 113 having a depth dimension larger than those for the source and drain diffusion layers 103 and 104, the effective isolation distance between the diffusion layers 103 and 104 is equal to twice the total distance of the width and depth dimensions of a trench 113. Therefore, it can be seen that, compared with the non-buried type conventional devices, the isolation dimension is substantially increased. In this case, the deeper the trench 113 than the source and drain diffusion layers 103 and 104, the higher would be the insulative isolation capability.

Additionally, especially in the device of this embodiment, the field-shield electrode does not protrude out on the surface of the substrate 101 as in the conventional devices, and the top surface of the field-shield electrode 107 is level with the surface of the substrate 101. It follows that the surface area required for the FSDI structure 112 needs to be only as large as the width dimension of the trench 113, thereby significantly reducing the area for the non-active region 111 compared with the conventional field shielding devices.

Furthermore, the field-shield electrode 107 is not insulated from the substrate 101 but is in electrical contact with the internal surface of the substrate 101 through the bottom surface of the trench 113. This configuration means that a voltage can be applied to the field-shield electrode 107 from the substrate 101 side, thus eliminating the need to provide the voltage application line necessarily on the top surface of the field-shield electrode 107. Therefore, it is obvious that the accumulation of such advantages accruing from the present configuration of the FSDI structure 112 will result in achieving higher device integration in a given space of a wafer, thus enabling to produce even more highly integrated MOSLSI devices.

Furthermore, according to the method for making MOSLSI device presented above, the planarization step for the wafer W by CMP method is carried out after the process of forming the polycrystalline film 119 by vapor deposition on the field-shield insulator film 106, there is no need for using photolithography for fabricating the field-shield electrode 107. This is a notable simplification in the processing steps compared with the conventional process requiring photomasking, resulting in considerable lowering in the manufacturing cost.

A fifth embodiment of the FSDI structure of the present invention will be explained with reference to FIG. 7.

There are two points of differences between the fourth embodiment device and the device of this embodiment. The first point is that the FSDI structure in the fifth embodiment is a multilayer structure, not a single layer structure presented in the fourth embodiment. The second point is that doping is carried out on the side-wall surfaces of the trenches also. Therefore, those components in FIG. 7 which are the same as those in the fourth embodiment are given the same reference numerals, and their explanations are omitted.

Subsequent to the trench-forming step shown in FIG. 6A for forming the trenches 113, the substrate 101 of this device is subjected to a diffusion step to diffuse the boron dopant to produce a P-type region 125 having a carrier concentration of about $10^{17}$~$10^{18}$ ions/cm$^3$ on all the interior surfaces of the trenches 113. Here, those areas of the interior surfaces close to the substrate 101 are replaced with N-type doped regions during a subsequent fabrication step to produce N-type source and drain regions.

Next, following the fabrication of a triple layer insulator film 129 comprising $SiO_2$ film 126-SiN film 127-$SiO_2$ film 128 (to act as the field-shield insulator film 106), the bottom surfaces of the trenches 113 are exposed by anisotropic etching and are covered over with a polycrystalline silicon film 119 by vapor deposition. As in the fourth embodiment, the top surface of the field-shield electrode 107 comprised of polycrystalline silicon film 119 is planarized and made level with the upper surface of the substrate 101 by CMP method.

The triple layer insulator film 129 is made by thermal oxidation of the surface of the substrate 1 including the interior surface of the trench 113 first, to produce a $SiO_2$ film 126 of 2~4 nm thickness, followed by forming a SiN film 126 of 4~12 nm thickness by vapor deposition process, followed by thermal oxidation of SiN film 126 to produce a $SiO_2$ film 128 of 1~4 nm thickness.

Figure 7:
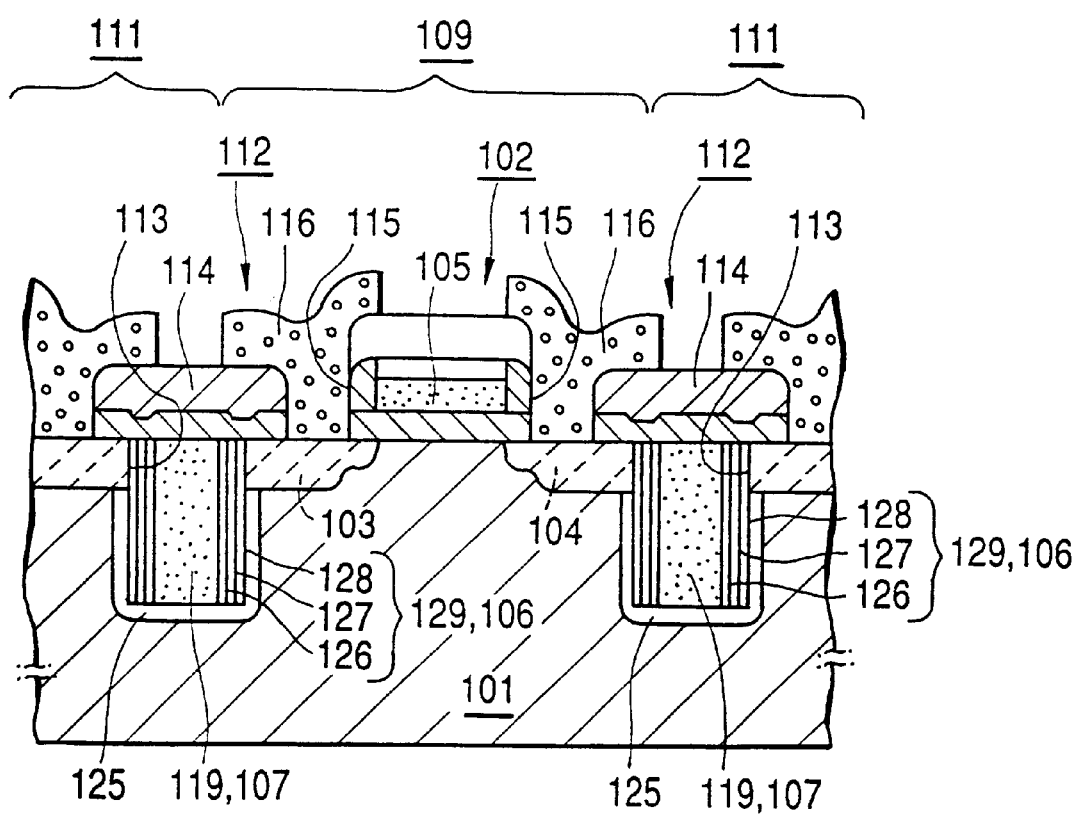
FIG. 7 is a vertical cross sectional view of a fifth embodiment of the semiconductor device of the present invention.

The subsequent processing steps are identical to those in the fourth embodiment, i.e., gate-insulator film forming step; gate electrode forming step; source and drain forming step; interlayer insulation forming step; contact hole fabrication step; line fabrication step are needed to complete the fabrication of MOSLSI device as shown in FIG. 7. In this embodiment, electrode lines 116 comprises aluminum device lines, and are made by filling the contact holes 115 with successive depositions of titanium nitride-tungsten films to extend, through the contact holes 115, to the upper surface of the interlayer insulator film 114 to make contact with other devices through the aluminum device lines.

As in the case of the fourth embodiment device, the same beneficial effects accrue from the FSDI structure 112 of this embodiment. That is, the field-shield electrode 107 in this embodiment also does not extend on the upper surface of the substrate 101 as in the conventional devices, and by eliminating the need for the voltage impression lead line to be provided necessarily on the top surface of the field-shield electrode 107, higher device integration can be achieved in a given space of a wafer. Coupled with the use of simple CMP method for making the surfaces of field-shield electrode 107 level with that the substrate 101, the configuration of the device enables to produce highly integrated MOSLSI devices economically.

On the other hand, in contrast to the fourth embodiment device, the trenches 113 in the MOSLSI device of this embodiment are provided with P-type regions 125 on its side-wall surfaces as well as on its bottom surface. Therefore, the P-type region 125 at the bottom surface can be used to supply voltage to the device, whereas the P-type region 125 on the side-wall surfaces of the device also functions to prevent the formation of inversion layers connecting the N-type source diffusion layers 103 with N-type drain diffusion layers 104. Thus, it can be seen that the adoption of the FSDI structure 112 will further enhance the isolation effects and the operating performance of a MOSLSI device.

Further, in the device of this embodiment, the film for constituting the field-shield insulator film 106 comprises SiO2 films 126, 128 and a SiN film 127. Therefore, the field-shield isolator film 106 can be effectively made from thin film components so further enhancing the isolation capability. The multilayer isolator film 129, comprising SiO2 films 126, 128 and a SiN film 127, is able to retain high electrical isolation even when the polycrystalline silicon 119 (constituting the field-shield electrode 107) contains phosphorous or boron. In other words, by making the field-shield insulator film 106 to be a multilayer film, a highly effective insulator film of thin film thickness with lesser number of defects can be produced, thus leading to higher device yield to provide economical production while offering enhanced isolation effect.

In the fourth and fifth embodiments, the planarization step of the wafer W using the CMP method was carried out after forming the polycrystalline deposit 119, however, it is also permissible to utilize dry etching involving a thick coating of a photoresist material applied all over on the surface of the wafer W to etch back the entire surface of the wafer W, or to utilize wet etching involving an etching solution mixture containing primarily hydrofluoric acid and nitric acid to etch back the surface to produce a planar surface. Even though different planarization approach may be taken, it is still possible to simplify manufacturing processes and achieve low cost production.

Also, it is not necessary to follow the previous embodiments in which the entire interior space of the trench 113 was filled to construct the field-shield electrode 107. It is permissible to have a hollow interior structure or to fill the interior by depositing polycrystalline silicon followed by vapor deposition of $SiO_2$. The surface may be made planar using the usual CMP method.

It should be noted that the dimensions quoted in the embodiments are meant to be illustrative, and they are not limited to the dimensions quoted. For example, it is permissible to have ranges of dimensions such as: 80 nm~several mm for the trench widths; the depth of the trench may be made deeper than the depth of the diffusion layers for source and drain components by up to 10 $\mu$m; the film thickness of the field-shield insulator film may range 5~200 nm; and the film thickness of the polycrystalline deposit may range 40~800 nm.

In the fifth embodiment, the triple-layer structure of the insulator film ($SiO_2$—SiN—$SiO_2$) may be replaced with a double-layer structure by omitting one of the $SiO_2$ films without affecting the shielding performance of the device of the present invention.

A sixth embodiment will be explained with reference to FIG. 8.

In this embodiment, the arrangement of the voltage application to the field-shield electrode will be explained with reference to the cross sectional view of the MOSLSI device and the lines shown in FIG. 8.

Figure 8:
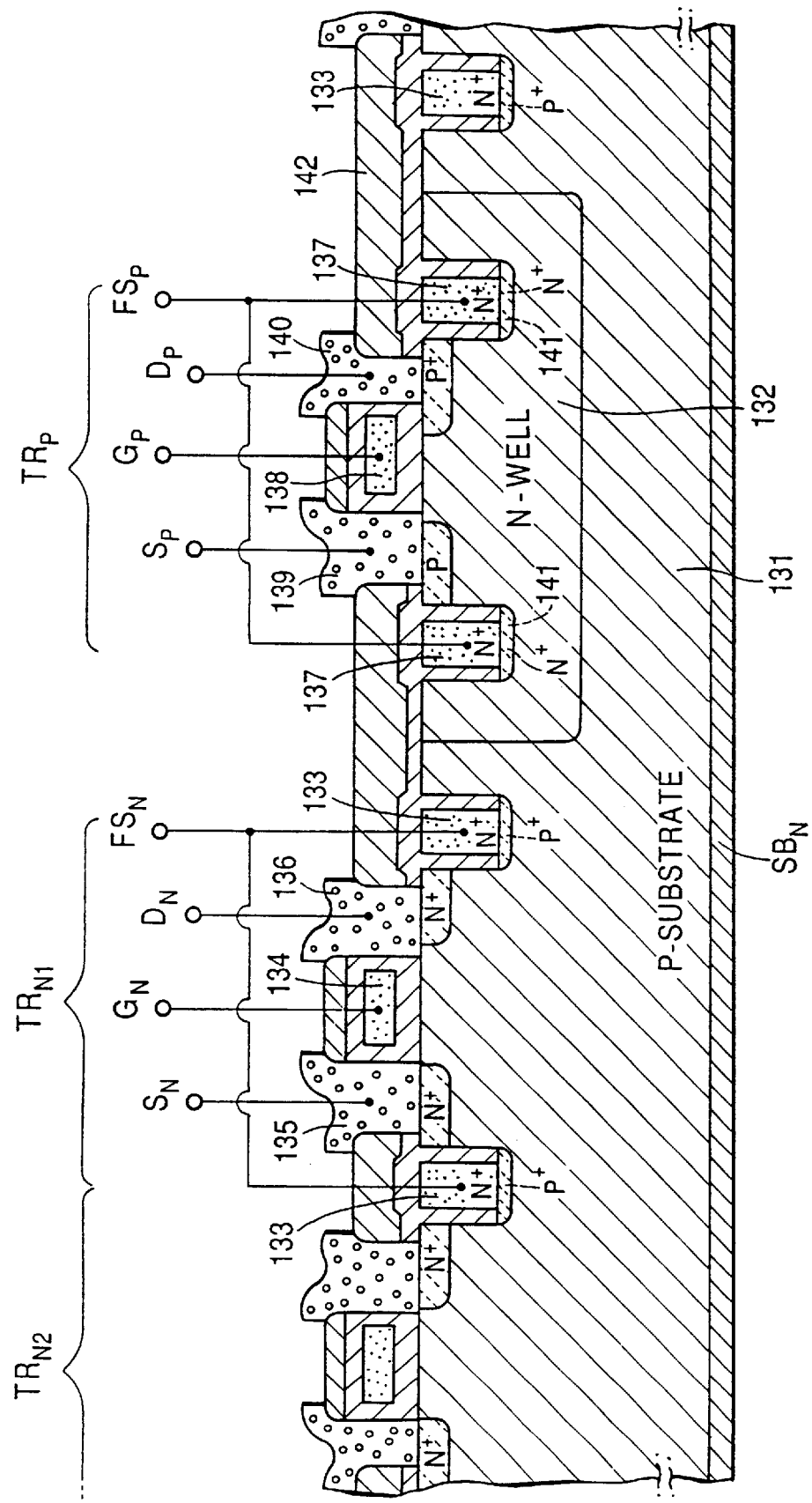
FIG. 8 is a vertical cross sectional view of a sixth embodiment of the semiconductor device of the present invention to particularly show the arrangement of applying voltages.

FIG. 8 shows a P-type single crystal silicon substrate 131 having an N-type region 132, the so-called "N-Well" region, fabricated on its surface. The N-well region 132 comprises a P-channel MOS transistor TRp. Adjacent to the N-well region 132, there are N-channel MOS transistors TRN1, TRN2, thereby providing an LSI device based on a CMOS structure on the surface of the substrate 131.

The isolation function for the N-channel MOS transistors TRN1, TRN2 is provided by the FSDI structures fabricated in the trenches formed between the transistors. As shown in FIG. 8, the N-channel MOS transistor TRN1 has an electrode line FSn from the field-shield electrodes 133, a gate line Gn from the gate electrode 134, a source line Sn from the N-type source diffusion layer 135, a drain line Dn from the N-type drain diffusion layer 136, and electrode lines SBN from the P-type substrate 131 through the bottom surface of the P-type substrate 131. Although the PN-junction is included between the P-type substrate 131 and the N-type field-shield electrode 133, the potential of the substrate electrode SBN is approximately the same as the potentials at the N-type field-shield electrode 133 and at the electrode line FSN.

In the meanwhile, the isolation function for the P-channel MOS transistor fabricated within the N-well region 132 is provided by a similar FSDI structures, and the electrode line FSp from each of the field-shield electrodes 137 is provided as necessary, a gate line Gp from the gate electrodes 138, a source line Sp from the P-type source diffusion layer 139, a drain line Dp from the P-type drain diffusion layer 140. The field-shield electrode 137 is made of an N-type polycrystalline silicon containing phosphorous (P), and the diffusion of P from the N-type polycrystalline silicon produces a high carrier N-type region 141 within the N-Well region 132, thus making the field-shield electrode 137 to be at the same potential as the N-Well region 132.

For any of the FSDI structures (separating the N-channel MOS transistors TRN1, TRN2 and P-channel MOS transistor TRp), the single layer structure presented in the fourth embodiment or the multi-layer structure presented in the fifth embodiment can be utilized. In the sixth embodiment device also, the electrode lines extend on the upper surface of the interlayer insulator film 142 parallel to the surface of the substrate 131.

The device in this embodiment includes an electrical power line electrode Vcc, Vss (not shown) for connecting to outside circuits. Vcc is supplied with a positive voltage (usually 5 volts) from an outside power source, and Vss is supplied with a reference voltage (usually 0 volt GND).

In the sixth embodiment device, the field-shield electrode 133 on the TRN1, TRN2 side of the N-channel MOS transistor is supplied with the substrate potential, and the substrate 131 is maintained at a negative voltage of −1~−3 volts which is the power circuit generation voltage of the device. The device is designed so that this voltage can be monitored through the electrode line FSN.

In the meanwhile, the potential of the electrode line FSp for the field-shield electrode 137 in the P-channel MOS transistor TRp side is positive and maintained approximately at the source potential, and the N-Well region 132 is also maintained positive at the source potential through the field-shield electrode 137.

It can be seen that, as in the devices presented in the fourth and fifth embodiments, the FSDI structure of this embodiment fabricated within the respective trenches belonging to each of N-channel MOS transistors and the P-channel MOS transistor is also highly suitable for adaptation to CMOSLSI devices for isolation of active regions.

Further, in the device of this embodiment, because the N-type field-shield electrode 133 and the P-type substrate 131 are electrically conductively joined, the basic function of the base electrode SBN to supply a potential to the substrate 131 has been extended. The base electrode SBN can perform the role of supplying the substrate potential to the N-type field-shield electrode 133 as well as to monitor the substrate potential through the electrode line FSN provided above the N-type field-shield electrode 133. Further, because the P-type field-shield electrode 137 and the N-Well region 132 are electrically conductively joined, the positive potential supplied to the P-type field-shield electrode 137 through the electrode line FSp is also supplied to the N-Well region 132, thus eliminating the need for providing a separate electrode line for the N-Well region 132.

In other words, in the design of the device presented in this embodiment, the need has been eliminated for providing individual electrode lines for different functions of the various electrodes, for example, potential supply to field-shield electrode, potential supply to the substrate or monitoring of various potentials. Therefore, it may be noted that an important consequence of the design demonstrated in the sixth embodiment device is that the elimination of the need to provide electrode lines above the different electrodes in the FSDI structure of the present invention leads logically to an overall simplification in the interconnection lines required for CMOSLSI devices.

In other words, the sixth embodiment demonstrated the application of the trench-type FSDI structure to the trench-type FSDI structure of the present invention in a CMOSLSI device to provide effective inter-transistor isolation or inter-diffusion region isolation, thereby showing a path to the future development of ultra-high density LSI circuitries.

It should be noted that the particular components and device arrangements used in the six embodiments presented above are illustrative and do not limit the scope of the principle of device design demonstrated in the present invention that the shielding effect of field-shield device isolation (FSDI) structure is enhanced by adopting a configuration of a trench-type field-shield electrode as well as trans-electrode single processing. It is clear that the FSDI structure presented is applicable to device isolation in a wide variety of semiconductor devices, such as DRAM and the like memory devices, microcomputer LSI, logic devices. It is also obvious that the application possibilities include PMOS, NMOS as well as CMOS devices.

What is claimed is:
1. A semiconductor device comprising:
a semiconductor substrate of a first conductivity type;
an arrangement of active regions on said semiconductor substrate separated by non-active regions, each active region including at least one functional semiconductor element;
a field-shield isolation structure fabricated in said non-active regions, said field-shield isolation structure comprising,
a field-shield insulator film on side-wall surfaces and a bottom surface of a trench cavity, said side-wall surfaces extending from an opening in an upper surface of the semiconductor substrate to the bottom surface of the trench cavity to define the trench as being completely within the semiconductor substrate, said field-shield insulator film providing electrical isolation between said active regions, and
a field-shield electrode in said trench cavity in contact with said field-shield insulator film, said field-shield electrode having a top surface level with said upper surface of the semiconductor substrate; and
wherein a depth-dimension of the trench cavity is deeper than a diffusion distance of a dopant species associated with the functional semiconductor elements in each of said active regions.

2. A semiconductor device comprising:
a semiconductor substrate having a first conductivity type;
an arrangement of active regions on said semiconductor substrate separated by non-active regions, each active region including at least one functional semiconductor element;
a field-shield isolation structure fabricated in said non-active regions, said field-shield isolation structure comprising,
a field-shield insulator film on side-wall surfaces of a trench cavity, said side-wall surfaces extending from an opening in an upper surface of the semiconductor substrate to a bottom surface of the trench cavity to define the trench as being completely within the semiconductor substrate, said field-shield insulator film providing electrical isolation between the active regions, and
a field-shield electrode in said trench cavity in contact with said field-shield insulator film, said field-shield electrode having a top surface level with the upper surface of the semiconductor substrate, said top surface being completely covered by an insulation layer and said field-shield electrode further having a bottom surface in electrical contact with the bottom surface of the trench cavity; and
wherein a depth dimension of the trench cavity is deeper than a diffusion distance of a dopant species associated with the functional semiconductor element in each of said active regions.

3. The semiconductor device as claimed in claim 2, wherein said field-shield electrode is in direct electrical contact with said semiconductor substrate through said bottom surface of said trench cavity and a doped region of said first conductivity type in a region of said semiconductor substrate abutting said bottom surface of said trench cavity.

4. The semiconductor device as claimed in claim 3, further including doped regions of said first conductivity type provided in portions of said semiconductor substrate extending along and opposite to said field-shield insulator film on said side-wall surfaces of said trench cavity.

5. The semiconductor device as claimed in one of claims 1 to 4, wherein said field-shield insulator film is a double-layer film comprising a silicon dioxide film formed on a silicon nitride film.

6. The semiconductor device as claimed in one of claims 1 to 4, wherein said field-shield insulator film is a double-layer film comprising a silicon nitride film formed on a silicon dioxide film.

7. The semiconductor device as claimed in one of claims 1 to 4, wherein said field-shield insulator film is a triple-layer film formed progressively towards said field-shield electrode, within said trench cavity, comprising a successive layers of a silicon dioxide film, a silicon nitride film and a silicon dioxide film.

* * * * *